(12) United States Patent
Liu

(10) Patent No.: US 12,191,770 B2
(45) Date of Patent: Jan. 7, 2025

(54) SYSTEM AND METHOD FOR MULTI-PHASE POWER CONVERSION AND CONTROL

(71) Applicant: Halo Microelectronics International, Campbell, CA (US)

(72) Inventor: Rui Liu, Fremont, CA (US)

(73) Assignee: Halo Microelectronics International, Campbell, CA (US)

( * ) Notice: Subject to any disclaimer, the term of this patent is extended or adjusted under 35 U.S.C. 154(b) by 268 days.

(21) Appl. No.: 17/969,568

(22) Filed: Oct. 19, 2022

(65) Prior Publication Data

US 2024/0136932 A1 Apr. 25, 2024
US 2024/0235400 A9 Jul. 11, 2024

(51) Int. Cl.
*H02M 3/158* (2006.01)
*H02M 1/08* (2006.01)
*H03L 7/081* (2006.01)

(52) U.S. Cl.
CPC ........... *H02M 3/1586* (2021.05); *H02M 1/08* (2013.01); *H03L 7/0812* (2013.01)

(58) Field of Classification Search
CPC ...... H02M 3/1586; H02M 1/08; H03L 7/0812
USPC ....................................................... 323/271
See application file for complete search history.

(56) References Cited

U.S. PATENT DOCUMENTS

| | | | | |
|---|---|---|---|---|
| 8,970,195 | B2* | 3/2015 | Zambetti | H02M 3/1584 323/283 |
| 10,511,226 | B1* | 12/2019 | Gurlahosur | H02M 3/1582 |
| 2014/0176097 | A1* | 6/2014 | Huang | G05F 1/59 323/272 |
| 2020/0228012 | A1* | 7/2020 | Lynch | H02M 3/158 |

* cited by examiner

*Primary Examiner* — Yemane Mehari
(74) *Attorney, Agent, or Firm* — AP3 Law Firm PLLC

(57) ABSTRACT

A controller for controlling a multi-phase power conversion system includes a pulse width modulation (PWM) comparator configured to generate a PWM signal based on a ramp signal, a voltage reference signal and a feedback voltage from the power conversion system. A circuit may be configured to generate, based on the PWM signal, PWM signals by delaying the PWM signal with different delay times, and feed the PWM signals to respective switching power converters of the multi-phase power conversion system, to regulate an output voltage of the power conversion system. Each switching power converter may include a control circuit configured to adjust a pulse width of a received PWM signal based on a reference current and an output current of a corresponding switching power converter, to generate an adjusted PWM signal, based on which, an output voltage of the corresponding switching power converter is regulated.

17 Claims, 10 Drawing Sheets

SYSTEM AND METHOD FOR MULTI-PHASE POWER CONVERSION AND CONTROL

TECHNICAL FIELD

The present disclosure relates generally to power conversion, and in particular embodiments, to techniques and mechanisms for multi-phase power conversion and control.

BACKGROUND

As technologies advance, electronic devices, such as smart phones, tablets, wearable devices, hand-held devices, and so on, are becoming more and more powerful, and are thus more power demanding. Power converters have been widely used to convert electricity energy from one voltage to another voltage to power electronic devices. As an example, a multi-phase power conversion system may include multiple power converters operating together to generate a desired output voltage to power electronic devices. A controller may be used to balance output currents of the multiple power converts and regulate the output voltage of the multi-phase power conversion system. It would be desirable to develop techniques to reduce the complexity and improve the performance of the multi-phase power conversion system.

SUMMARY

Technical advantages are generally achieved, by embodiments of this disclosure which describe a system and method for multi-phase power conversion and control.

In accordance with an embodiment of the present disclosure, a control system for controlling a multi-phase power conversion system is provided. The control system includes: a pulse width modulation (PWM) comparator, configured to generate a first PWM signal based on a ramp signal, a voltage reference signal and a first voltage signal. The first voltage signal is a feedback voltage from the multi-phase power conversion system. The multi-phase power conversion system includes N switching power converters, and N is an integer greater than 1. The control system further includes a first circuit coupled with the PWM comparator and configured to: receive the first PWM signal from the PWM comparator; generate, based on the first PWM signal, N PWM signals by delaying the first PWM signal with different delay times, a $k^{th}$ PWM signal of the N PWM signals being the first PWM signal delayed with a delay time of $(k-1)\Delta t$, wherein $\Delta t$ is a first delay time, k is an integer, and $1 \le k \le N$; and feed the N PWM signals to the N switching power converters, respectively, to regulate an output voltage of the multi-phase power conversion system.

In accordance with another embodiment of the present disclosure, a multi-phase power conversion system is provided. The multi-phase power conversion system includes N power converters, and each of the N power converters includes a control circuit that is configured to: receive a first pulse width modulation (PWM) signal from a controller of the multi-phase power conversion system, the PWM signal being based on an output voltage of the multi-phase power conversion system; adjust a pulse width of the first PWM signal based on a delay lock loop (DLL) signal to generate an adjusted PWM signal, the DLL signal being based on a reference current and an output current of a corresponding power converter of the N power converters; and regulate an output voltage of the corresponding power converter of the N power converters based on the adjusted PWM signal.

Embodiments of the present disclosure simplify the multi-phase power conversion system and improve performance of the multi-phase power conversion system.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Figure 1:
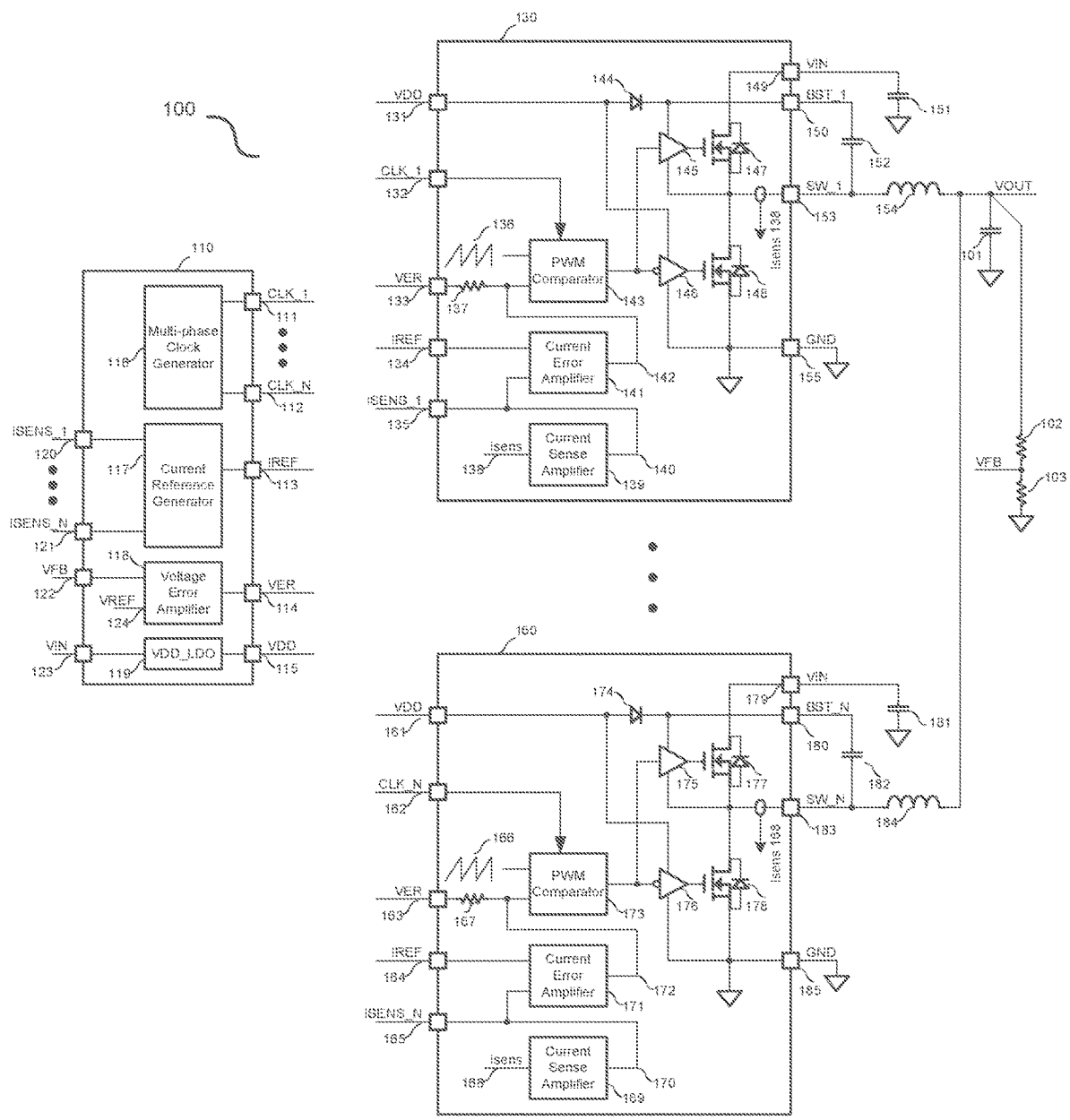
FIG. 1 is a diagram of an example conventional multi-phase power conversion system.

FIG. 1 is a diagram of an example conventional multi-phase power conversion system 100. The multi-phase power conversion system 100 includes a multi-phase (N-phase in this example) controller system (or circuit) 110, and a multi-phase power converter system including N power converters (or power conversion subsystems/circuits). N is an integer greater than 1. As shown in FIG. 1, the multi-phase power converter system includes a first power converter 130, . . . and a $N^{th}$ power converter 160.

The multi-phase controller system 110 includes a multi-phase clock generator 116, a current reference generator 117, a voltage error amplifier 118, and a supply VDD_LDO 119. The multi-phase clock generator 116 is configured to generate a clock signal for each power converter of the N power converters, resulting in N clock signals for the N respective power converters, e.g., clock signals CLK_1 111, . . . , and CLK_N 112. The multi-phase clock generator 116 may have N output terminals, each of which is connected to a power converter of the N power converters. The N clock signals are fed, via the N respective output terminals, to the N power converters. As shown, the clock signal CLK_1 111 is fed to the first power converter 130 and re-labeled as a clock signal CLK_1132 therein, and the clock signal CLK_N 112 is fed to the power converter 160, and is re-labeled as a clock signal CLK_N 162 therein.

The current reference generator 117 is configured to take sensed current signals from the N power converters as input, i.e., ISENS_1 120-ISENS_N 121, and generate a current reference signal, i.e., IREF 113. The current reference signal IREF 113 may be used to balance the output currents (also referred to as output inductor currents, e.g., the currents flowing through the inductor 154 and inductor 184) of the N power converters such that all power converters may deliver an equal output current to achieve better thermal performance. The current reference generator 117 only produces one output signal, i.e., IREF 113 (the current reference signal), which is connected to each power converter. As an example, the current reference signal IREF 113 is connected to (and fed to) the first power converter 130 and is re-labeled as IREF 134 therein, and the current reference signal IREF 113 is connected to the $N^{th}$ power converter 160 and is re-labeled as IREF 164 therein. The current reference generator 117 has N inputs for receiving the sensed current signals from the N power converters, which creates many interconnections between the multi-phase controller system 110 and the N power converters.

The voltage error amplifier 118 is configured to compare a feedback output voltage provided by the multi-phase power converter system, i.e., VFB 122, with a reference output voltage, i.e., VREF 124, and generate a voltage error signal VER 114. The voltage error signal VER 114 may be used by each power converter to regulate its corresponding output voltage to a desired value. As shown, the VER 114 is fed to each of the N power converters, which is re-labeled as VER 133 at the first power converter 130, and as VER 163 at the $N^{th}$ power converter 160.

The VDD_LDO 119 is configured to provide a regulated supply voltage VDD 115 based on an input voltage VIN 123, which may be used to power up function blocks of the multi-phase controller system 110 as well as other function blocks of the N power converters. The VDD 115 may be fed to each of the N power converters, which is re-labeled as VDD 131 at the first power converter 130, and as VDD 161 at the $N^{th}$ power converter 160.

The multi-phase controller system 110 may be integrated into a single integrated circuit (IC) as shown in FIG. 1, where the small squares indicate connection pins of the IC.

For a N-phase power conversion system, there are N power converters, and all power converters are identical. For example, as shown, the first power converter 130 is identical to the $N^{th}$ power converter 160 in FIG. 1. In the following, the first power converter 130 will be used as an example for illustration. Other power converters have structures similar to and operate similarly to the power converter 130, and will not be described repetitively. The power converter 130 includes a pulse width modulation (PWM) comparator 143, a current sense amplifier 139, a current error amplifier 141, a buck converter, and power switch drivers 145 and 146. The buck converter includes an input filter capacitor 151, a bootstrap capacitor 152, power switches 147 and 148, an output inductor 154, and an output capacitor 101 shared by the N power converters. The bootstrap capacitor 152 is connected to VDD through a diode 144. When power switch 148 is turned on, the switching node 153 is pulled to ground and the bootstrap capacitor 152 is charged by VDD through the diode 144. The buck converter is connected to an input source VIN at input node 149.

The current sense amplifier 139 is configured to generate, based on a sensed current Isens 138 of the first power converter 130, a current signal 140 that is proportional to the current Isens 138, and feed the current signal 140 to the current error amplifier 141. The current signal 140 may be the amplified Isens 138. The current signal 140 is also used as a sensed current signal (i.e., ISENS_1135) of the power converter 130, and fed to the multi-phase controller system 110 as the ISENS_1 120.

The current error amplifier 141 is configured to compare the current signal 140 with the current reference signal IREF 134 to generate a current error signal 142. The current error signal 142 works together with a resistor 137 to alternate the voltage error signal VER 133 that is fed to the PWM comparator 143 from the multi-phase controller system 110.

The PWM comparator 143 is configured to take the alternated voltage error signal VER 133, and compare it with an (internal) ramp signal 136 to generate a PWM signal at an output of the PWM comparator 143 connected to the power switch drivers 145 and 146. The PWM signal is used to regulate the output voltage VOUT of the multi-phase converter system to a desired value, and to balance the output current of the power converter 130 with output currents of other power converters of the multi-phase converter system. The ramp signal 136 may be a fixed voltage ramp signal (e.g., in a voltage mode control scheme), an output inductor current signal (e.g., in a peak current or average current mode control scheme) of the power converter 130, or an artificial ripple voltage (e.g., in hysteresis control and Constant-On-Time (COT) control scheme).

Each power converter of the N power converters may be integrated into a single IC with or without the power switches (e.g., power switches 147, 148). FIG. 1 shows an example where the power converters are each integrated into a single IC with power switches. The small squares indicate pins of the IC.

The output voltage VOUT of the multi-phase power converter system is sensed and regulated at the terminals of the output capacitor 101 through a feedback resistor network including resistors 102 and 103, and is fed back to the multi-phase controller system 110. To smooth both the input and output ripple voltages, the multi-phase power conversion system 100 is generally operated in an equal phase-shift mode, i.e., the high side power switch of each power converter, e.g., the power switch 147 in the first power converter 130, is turned on at equal phase-shift over one switching period. For example, in a 4-phase power conversion system, the high side power switches of the four power converters are turned on at 0 degree, 90 degree, 180 degree, and 270 degree phase shift over one switching period. The power switch 148 may be referred to as a low side power switch.

In the multi-phase power conversion system 100, each power converter must have a PWM comparator in order to generate a control signal (i.e., the PWM signal) to regulate its output voltage to a desired value. Further, the voltage error signal VER 133, before being input into the PWM comparator 143, is adjusted by the current error signal 142 output by the current error amplifier 141, in order to balance the output inductor currents among the N power converters. The current error amplifier (e.g., 141) is thus in the main voltage feedback loop (e.g., VFB 122-voltage error amplifier 118-VER 114 (VER 133 alternated by current error signal 142)-PWM comparator 143-VFB) of each power converter, and the current balance loop (e.g., Isens 138-current sense amplifier 139-ISENS_1 135-current reference generator 117-IREF 113 (IREF 134)-current error amplifier 141-PWM comparator 143-PWM signal-Isens 138) must be closed well below the close-loop frequency of the voltage feedback loop in order for the multi-phase power conversion system 100 to operate stably, and to avoid oscillation of the output inductor currents of the N power converters. When the output inductor currents of the multiple power converters oscillate, as an example, a first power converter may have a small output inductor current and a second power converter may have a large output inductor current over a few operation cycles, and the first power converter may have a large output inductor current and the second power converter may have a small output inductor current over the next a few operation cycles. The output current of a power converter may oscillate in a large current range during operation cycles. Oscillation of the output inductor currents may generate sever thermal performance issue or cause the system malfunction. It would thus be desirable to eliminate the PWM comparator from the power converters and the VER signal provided by the multi-phase controller system 110 to each power converter. The analog signal VER is a sensitive signal and may be complicated by switching noises on a power converter. It would also be desirable to remove the current balance loop from the main voltage loop and limit the amount of the PWM signal that the current balance loop can modify to avoid large oscillations among the output inductor currents. In addition, if the peak current mode control scheme is used, wide band current amplifier and slope compensation circuit may be needed to make the PWM comparator work properly, which, however, results in more susceptibility of the PWM comparator to switching noises and more complicated power converters.

Embodiments of the present disclosure provide a system for multi-phase power conversion and control. Embodiments of the present disclosure reduce the system complexity by using only one PWM comparator in the system, reduce the interconnections between a multi-phase controller device (or system/circuit) and multiple power converters (or power conversion devices/circuits), and provide current sharing with less or without possible oscillations among output inductor currents of the multiple power converters.

In some embodiments, a multi-phase power conversion system may include a multi-phase controller and multiple power converters. The multi-phase power conversion system may only include one PWM comparator that resides inside the multi-phase controller of the multi-phase power conversion system. The PWM comparator may be configured to generate a master PWM control signal. The master PWM control signal may be delayed to generate multiple PWM control signals that are used to control buck converters of the multiple power converters, respectively. A delayed PWM signal may be modified locally by each power converter to achieve output inductor current balance among the multiple power converters. It is thus the PWM signal, instead of a voltage error signal, that is modified and used to balance the output inductor currents at each power converter, and the current balance loop is removed from the main voltage feedback loop of the multi-phase power conversion system. In addition, the amount of modification made to the PWM signals may be well controlled digitally and be made on-the-fly.

Figure 2:
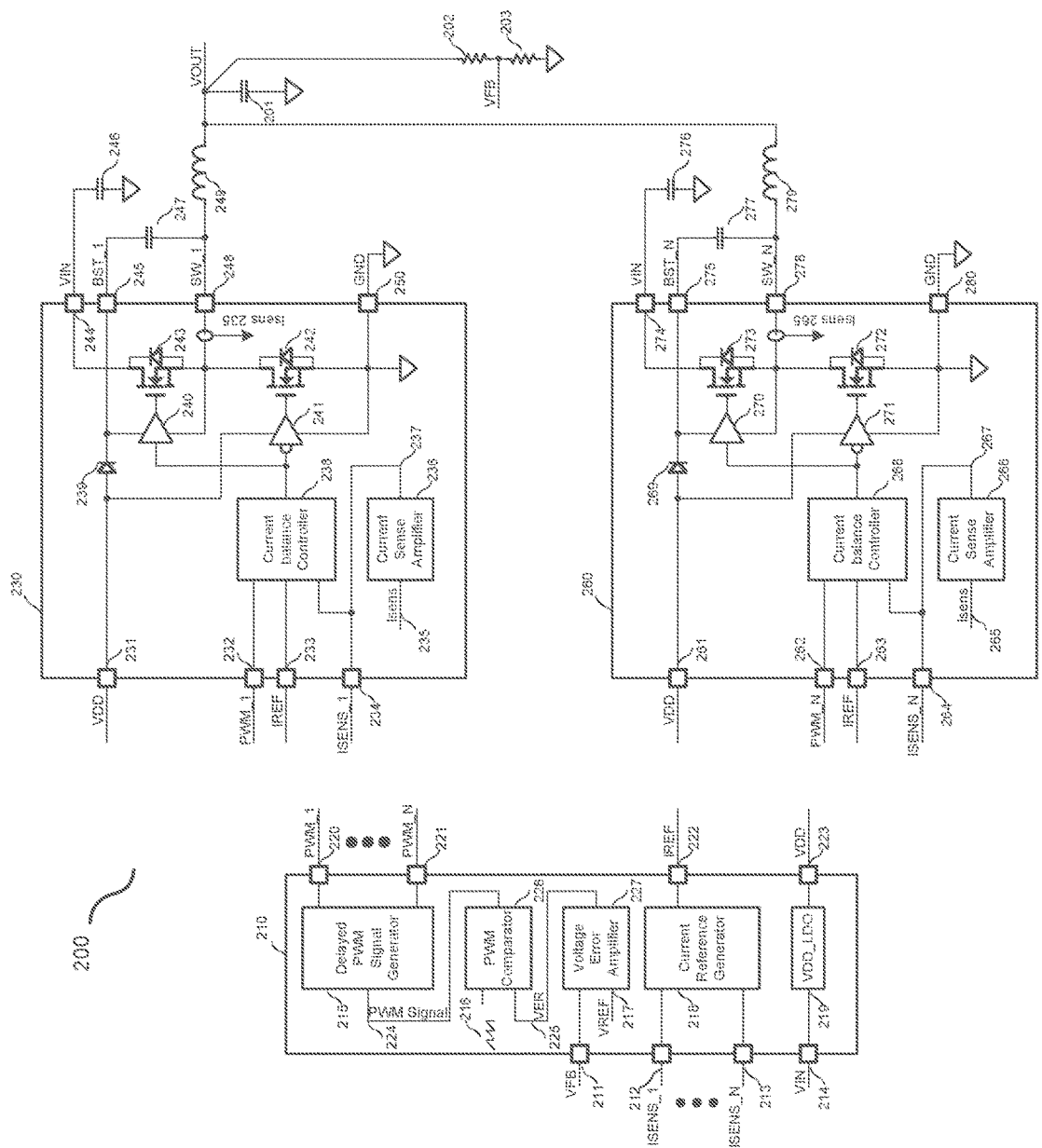
FIG. 2 is a diagram of an embodiment multi-phase power conversion system.

FIG. 2 is a diagram of an embodiment multi-phase power conversion system 200. The embodiment system 200 includes a multi-phase controller 210 and a multi-phase converter system configured to convert an input voltage to an output voltage VOUT. The multi-phase converter system includes N power converters, i.e., a first power converter 230, . . . , and an $N^{th}$ power converter 260, where N is an integer greater than 1. The multi-phase controller 210 is configured to control the N power converters to regulate the output voltage VOUT of the multi-phase converter system, and to regulate the output inductor currents of the N power converters in order to balance the output inductor currents. The multi-phase controller 210 may also be referred to as a multi-phase controller system, control system or circuit. The power converters may also be referred to as switching power converters, or power conversion subsystems/circuits.

The multi-phase controller 210 includes a PWM comparator 226, a voltage error amplifier 227, a current reference generator 218, a delayed PWM signal generator 215, and a VDD_LDO 219. The multi-phase controller 210 may be implemented by discrete components or integrated into a single IC. FIG. 2 shows an example where the multi-phase controller 210 is integrated into a single IC, and the small squares represent connection pins of the IC.

The voltage error amplifier 227 is configured to compare a feedback output voltage provided by the multi-phase power converter, i.e., VFB 211, with a reference voltage, i.e., VREF 217, and generate a voltage error signal VER 225.

The PWM comparator 226 is configured to take the voltage error signal VER 225 and compare it with a ramp signal 216 to generate a master PWM signal 224. The master PWM signal 224 may be used to regulate the output voltage of the multi-phase power conversion system 200 to a desired value.

The delayed PWM signal generator 215 is configured to take the master PWM signal 224 as input and generate N PWM signals (also referred to as PWM control signals) for the N power converters with desired time delays. As an example, the delayed PWM signal generator 215 may delay the master PWM signal 224 with different delay times to generate the N PWM signals corresponding to the N power converters, i.e., PWM_1 220, . . . , PWM_N 221. The N PWM signals may also be referred to as delayed PWM signals or PWM control signals. The N PWM signals are fed to the N power converters, respectively. For example, PWM_1 220 is fed to the first power converter 230 and is re-labeled as PWM_1 232 therein; and PWM_1 221 is fed to the $N^{th}$ power converter 260 and is re-labeled as PWM_1 262 therein. The PWM signals may be used to achieve equal phase shift operation. Further description about the delayed PWM signal generator will be provided later in the present disclosure.

The delayed PWM signals are actual PWM control signals used to turn on and off high side power switches of the N power converters, e.g., the power switch 243 in the first power converter 230 and the power switch 273 in the $N^{th}$ power converter 260. This eliminate the need to include a PWM comparator circuit/block inside each power converter, and thus eliminate the related interconnections between the multi-phase controller 210 and the power converters. Further, since the voltage error signal VER 225 is maintained inside the multi-phase controller 210, and not in the power converters and not used by the power converters, the noise impact on VER 255 caused by the switching noises of the power converters is eliminated.

The current reference generator 218 is configured to take sensed output current signals of the N power converters, i.e., ISENS_1 212, ... ISENS_N 213, and generate a current reference signal 222 by passing its input (i.e., the sensed output current signals) to a low pass filter to remove the switching frequency ripple current contents of the input. The current reference signal 222 may be fed to each of the N power converter, which is, e.g., re-labeled as IREF 233 at the first power converter 230, and IREF 263 at the $N^{th}$ power converter 260.

In some embodiments, the current reference generator 218 may be configured to use sensed output current signals from some of the N power converters, e.g., the first and the last ($N^{th}$) power converters, instead of from all power converters, to generate the IREF 222. This reduces connections between the multi-phase controller 210 and the N power converters. In one example, the sensed output current signal from the first power converter 230, i.e., ISENS_1 212, may be used as a primary input to the current reference generator 218 to generate the IREF 222, and the sensed output current signal from the last power conversion subsystem, i.e., ISENS_N 213, may be used as a backup signal in case the first power converter 230 has malfunction. Such IREF 222 signal generation greatly reduces the interconnections between the power converters. The VDD_LDO 219 is configured to generate, based on an input voltage VIN 214, a supply voltage VDD 223 to power function blocks inside the multi-phase controller 210 and control blocks of the N power converters. The VDD 223 is provided to each of the N power converters, e.g., the re-labeled VDD 231 and VDD 261 at the first power converter 230 and the $N^h$ power converter 260.

The N power converters are identical. Taking the first power converter 230 as an example for illustration, the first power converter 230 includes a current balance controller 238, a current sense amplifier 236, power switch drivers 240, 241, and a buck converter. The buck converter includes an input filter capacitor 246, a bootstrap capacitor 247, power switches 242, 243, an output inductor 249, and an output filter capacitor 201 shared by the N power converters. Similarly, the $N^{th}$ power converter 260 includes a current balance controller 268, a current sense amplifier 266, power switch drivers 270, 271, and a buck converter. The buck converter includes an input filter capacitor 276, a bootstrap capacitor 277, power switches 272, 273, an output inductor 279, and the shared output filter capacitor 201.

In the following, the first power converter 230 will be used as an example for description. The other power converters of the N power converters have structures similar to and operate similarly to the first power converter 230, and will not be described repetitively.

The current sense amplifier 236 is configured to receive a sensed output current Isens 235 and generate a current signal 237 that is proportional to the Isens 235. The current signal 237 is fed to the current balance controller 238. The current signal 237 is also output as a current signal ISENS_1234, which is fed to the multi-phase controller 210 as the sensed current signal ISENS_1 212.

The current balance controller 238 is configured to take the PWM signal PWM_1 232 corresponding to the first power converter 230, the IREF 233 and the current signal 237 as input signals, and generate a control signal to regulate the output inductor current of the first power converter 230 to make it follow the desired inductor current value that is carried out by the IREF 233. Further description about the current balance controller 238 will be provided later in the present disclosure.

The output voltage VOUT of the multi-phase power conversion system 200 is sensed and regulated at the terminals of the output filter capacitor 201 through a feedback resistor network including resistors 202 and 203, and is fed back to the multi-phase controller 210 as the VFB 211. To smooth both the input and output ripple voltages, the multi-phase power conversion system 200 is generally operated in an equal phase-shift mode. The high side power switch of each power converter, e.g., the power switch 243 in the power converter 230, is turned on at equal phase-shift over one switching period. As an example, for a 4-phase power conversion system, the high side power switches of the 4 power converters are turned on at 0 degree, 90 degree, 180 degree, and 270 degree phase shift over one switching period.

The N power converters each may be implemented in a discrete component form or integrated into a single IC. For integrating a power converter into a single IC, there may be two options, i.e., integrating the power switches, or not integrating the power switches. FIG. 2 shows an example where each power converter is integrated into a single IC with the power switches. The small squares represent connection pins of the IC.

Any applicable buck control scheme may be employed by the multi-phase controller 210. The ramp signal 216 of the PWM comparator 226 may be a voltage ramp signal with a fixed switching frequency if the voltage mode control scheme is used. The ramp signal 216 may be a current signal of an output inductor of a power converter (e.g., the power converter 230 or 260) with a fixed switching frequency, if the peak current mode or average current mode control scheme is used. The ramp signal 216 may be an output ripple voltage or artificially generated ripple voltage if the Constant-On-Time (COT) or hysteresis control scheme is used.

The embodiment multi-phase power conversion system has the following advantages. First, the interconnections between the multi-phase controller and the power converters in the conventional approach are removed, and the voltage error signal VER does not go out of the multi-phase controller. Second, the power converters are simplified as the PWM comparator is removed. Third, the issue caused by sensitivity of the PWM signals to switching noises is eliminated. Fourth, current balance control among power converters is not part of the voltage feedback loop, as the current balance is achieved by directly adjusting the PWM signals provided to the power converters. In addition, the amount of modification of the delayed PWM signal is limited, which eliminates the possible large oscillations among the output inductor currents of the power converters. Furthermore, the amount of PWM signal modification may be made on-the-fly. This means that the amount of PWM signal modification can be adjusted adaptively under the line and load operation conditions, which is not possible with the traditional current balance loop.

The above mentioned control schemes, the current reference generator, the VDD_LDO and the current sense amplifier are well known in the art, and their operations are thus not described herein. Operations of the delayed PWM signal generator 215 in the multi-phase controller 210 and the current balance controller 238 in the power converter 230 will be described in the following.

Figure 3:
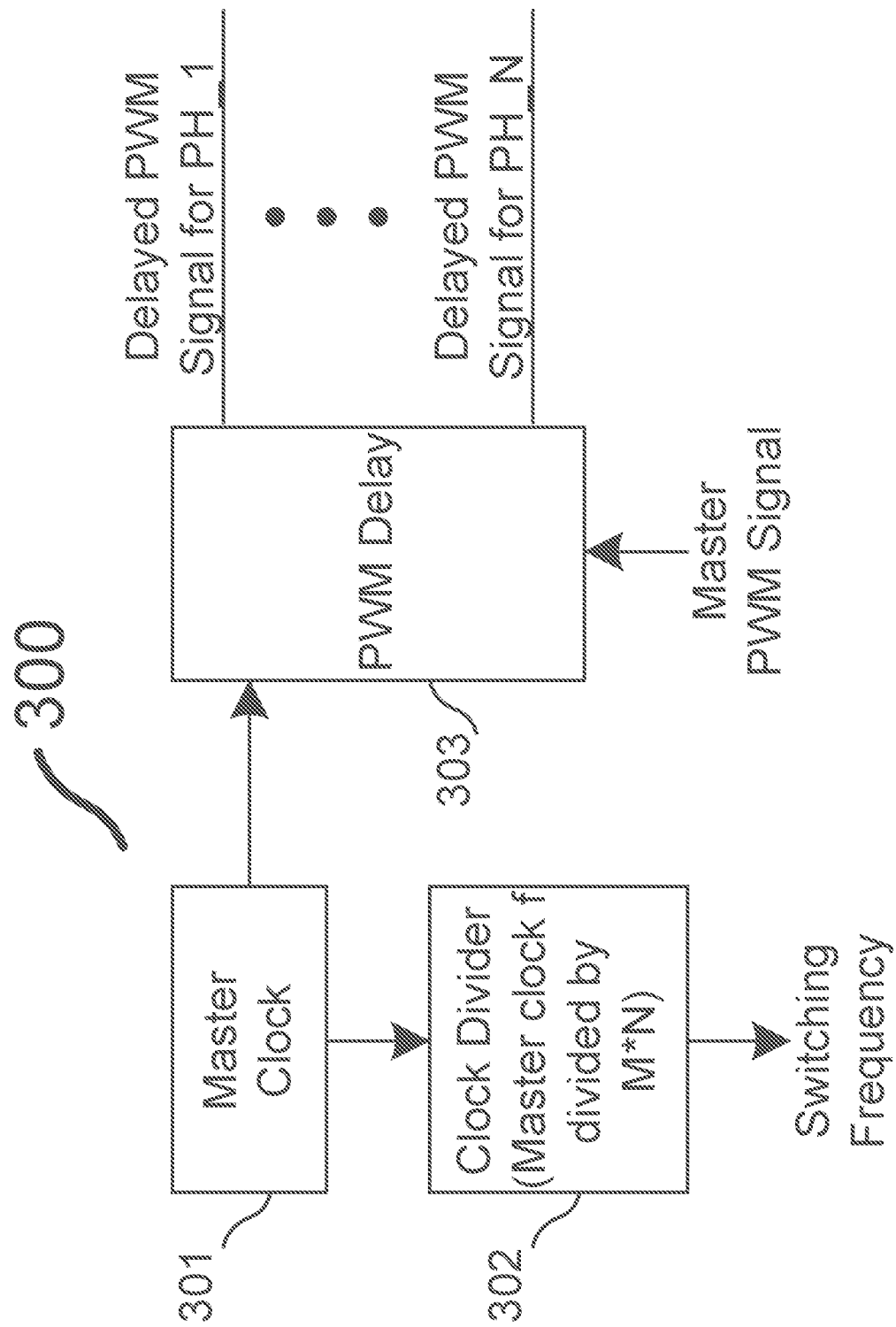
FIG. 3 is a diagram of an embodiment delayed PWM signal generator that may be used for a control scheme with fixed switching frequency in the multi-phase power conversion system of FIG. 2.

FIG. 3 is a diagram of an embodiment delayed PWM signal generator 300, which may be used in cases where a control scheme with a fixed switching frequency is used, such as the voltage mode or peak current mode control scheme. The delayed PWM signal generator 300 may be used to implement the delayed PWM signal generator 215 of the multi-phase controller 210 in FIG. 2, to generate multiple delayed PWM signals for multiple power converters of a multi-phase power conversion system. The delayed PWM signal generator 300 includes a master clock unit/block/circuit 301, a clock divider unit/block/circuit 302, and a PWM delay unit/block/circuit 303.

The master clock circuit 301 is configured to generate a clock signal, based on which the PWM delay circuit 303 generates delayed PWM signals. For a N-phase power conversion system including N power converters, in one embodiment, the master clock frequency is equal to or is M*N times of a desired switching frequency. M and N are positive integers. N represents the total number of power converters of a multi-phase power conversion system. N is great than 1. M is equal to 2 W, where "W" is an integer greater than or equal to zero (o). As an example, for a 4-phase power conversion system with a desired switching frequency of 1 MHz, the master clock frequency may be 4 MHz or 8 MHz or 16 MHz, and so on. In this example, N is 4, and M=1, 2, 4 for 4 MHz, 8 MHz, and 16 MHz master clock frequencies, respectively. The actual master clock frequency may also depend on the resolution of the PWM delay circuit 303. The resolution of the PWM delay circuit 303 is a unit of delay time that the PWM delay circuit 303 may use to delay an input signal. The PWM delay circuit 303 may delay the input signal with a delay time that is a multiple of the unit of delay time. If a desired resolution of the PWM delay circuit 303 is ions, the master clock frequency needs to be equal to or greater than 1/ion=100 MHz. In this case, for the example of the 4-phase power conversion system, the master clock frequency may be at least 160 MHz.

The clock divider circuit 302 is configured to divide the master clock frequency by M*N to generate a switching frequency clock signal for the multi-phase power conversion system. The PWM delay circuit 303 is configured to generate, based on the clock signal generated by the master clock circuit 301 and a master PWM signal, delayed PWM signals for multiple power converters, e.g., delayed PWM signal for power converters PH_1, . . . , and PH_N, as shown in the example of FIG. 3. The PWM delay circuit 303 may delay the master PWM signal with different delay times to generate the delayed PWM signals.

Figure 4:
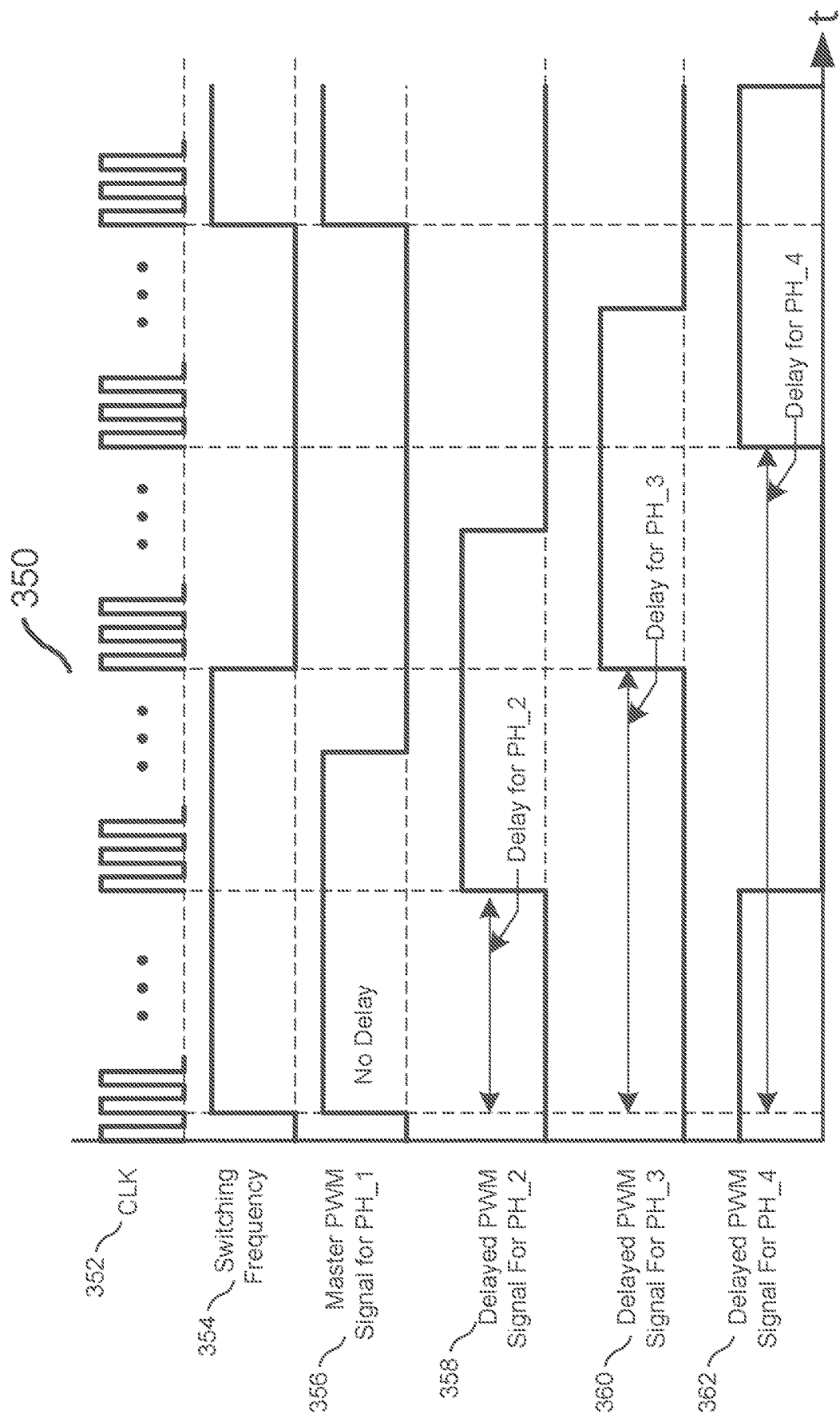
FIG. 4 is a diagram of example waveforms of signals generated during operation of the embodiment delayed PWM signal generator in FIG. 3.

FIG. 4 is a diagram 350 of example waveforms of signals generated during operation of the embodiment delayed PWM signal generator 300 in FIG. 3, using a 4-phase power conversion system as an example having four power converters. FIG. 4 shows six waveforms. Waveform 352 is the master clock signal, CLK. Waveform 354 is the switching frequency clock (signal) having a frequency that is derived by dividing the master clock frequency down. Waveform 356 is the master PWM signal without time delay with respect to the rising edge of the switching frequency clock. The master PWM signal without time delay may be used as a first delayed PWM signal (with zero delay) fed to a first power converter PH_1 of the four power converters in the 4-phase power conversion system. The master PWM signal has a pulse width smaller than the switching frequency clock. The duty cycle of the master PWM signal, in this example, is less than 50%. The duty cycle of the master PWM signal may be in a range between 0% and 100% in real applications. In the following descriptions, all time delays are with respect to the rising edge of the switching frequency clock.

Waveform 358 is a second delayed PWM signal that may be used for a second power converter PH_2 of the four power converters in the 4-phase power conversion system. The rising edge of the waveform 358 is delayed about one quarter of the period of switching frequency clock. The duty cycle of the second delayed PWM signal is the same as that of the master PWM signal. Waveform 360 is a third delayed PWM signal that may be used for the third power converter PH_3 of the four power converters in the 4-phase power conversion system, with a delay about half of the period of the switching frequency clock. The duty cycle of the third delayed PWM signal is the same as that of the master PWM signal. Waveform 362 is a fourth delayed PWM signal that may be used for the fourth power converter PH_4 of the four power converters in the 4-phase power conversion system, with a delay about three quarters of the period of the switching frequency clock. The duty cycle of the fourth delayed PWM signal is the same as that of the master PWM signal.

Figure 5:
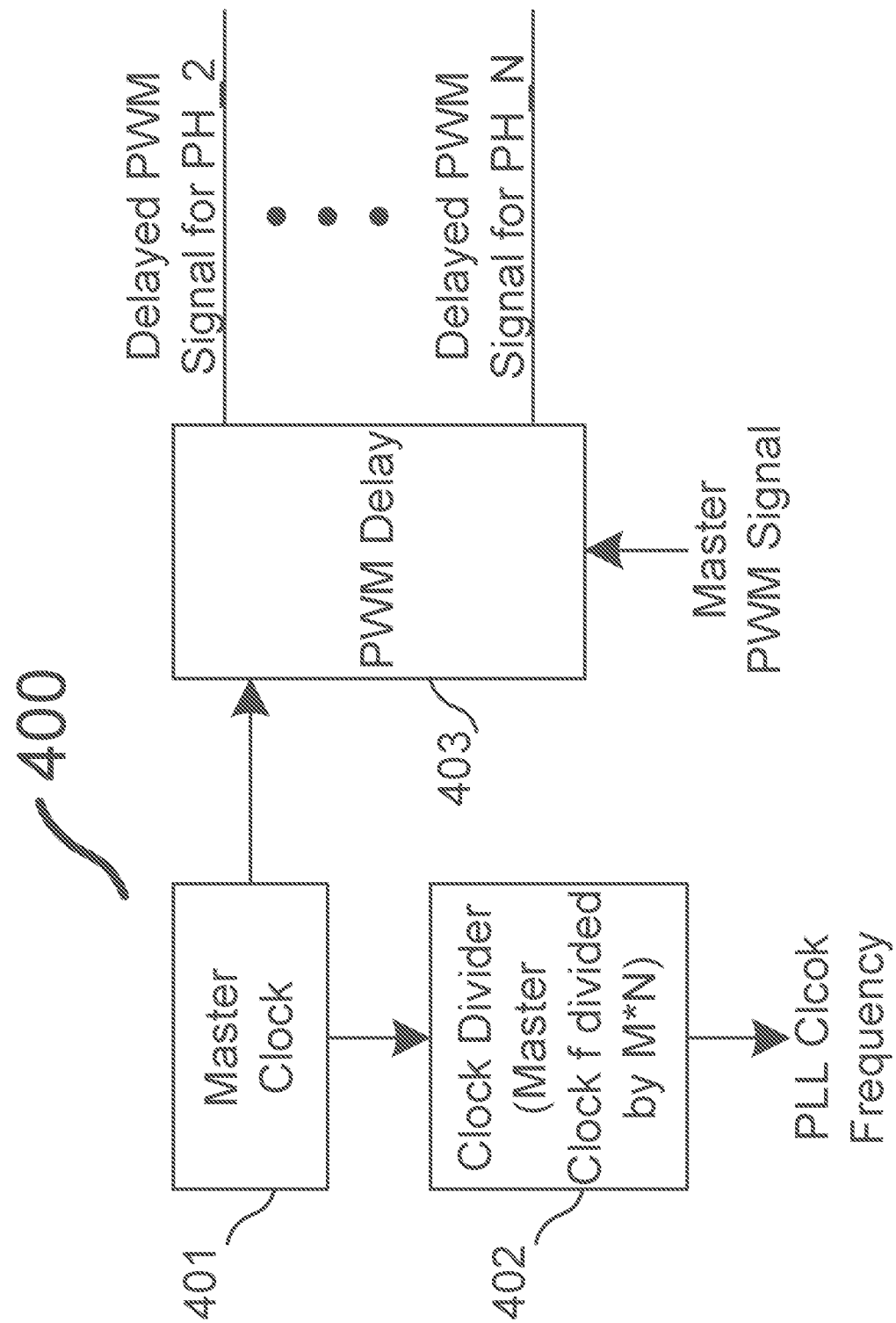
FIG. 5 is a diagram of another embodiment delayed PWM signal generator that may be used for a control scheme with variable switching frequency multi-phase power conversion system.

FIG. 5 is a diagram of another embodiment delayed PWM signal generator 400 for control schemes with a variable switching frequency, such as COT and hysteresis controls. The delayed PWM signal generator 400 may be used to implement the delayed PWM signal generator 215 of the multi-phase controller 210 in FIG. 2. The delayed PWM signal generator 400 is configured to generate multiple delayed PWM signals for multiple power converters of a multi-phase power conversion system. The delayed PWM signal generator 400 includes a master clock circuit/block/unit 401, a clock divider circuit/block/unit 402, and a PWM delay circuit/block/unit 403.

The master clock circuit 401 is similar to the master clock circuit 301, and is configured to generate a clock signal, based on which the PWM delay circuit 403 generates the delayed PWM signals, e.g., for N respective power converters of a N-phase power conversion system.

The clock divider circuit 402 is configured to divide the master clock frequency by M*N to generate a PLL (phase lock loop) clock signal (with a PLL clock frequency). The PLL clock signal may be used to regulate the switching frequency of the N-phase power conversion system to a desire range for proper multi-phase operations. The numbers "M" and "N" have definitions that are similar to those previously described with respect to the delayed PWM signal generator 300 in FIG. 3. M and N are positive integers. N is greater than 1. M is equal to 2 W, where "W" is an integer greater than or equal to zero (o). The criteria for determining M is also similar to those previously described with respect to the delayed PWM signal generator 300 in FIG. 3.

The PWM delay circuit 403 is similar to the PWM delay circuit 303 in FIG. 3. The PWM delay circuit 403 is configured to generate, based on the clock signal generated by the master clock circuit 401 and a master PWM signal, delayed PWM signals for multiple power converters, e.g., delayed PWM signal for power converters PH_1, ..., PH_N, as shown in the example of FIG. 5. The PWM delay circuit 403 delays the master PWM signal with different delay times to generate the delayed PWM signals.

Figure 6:
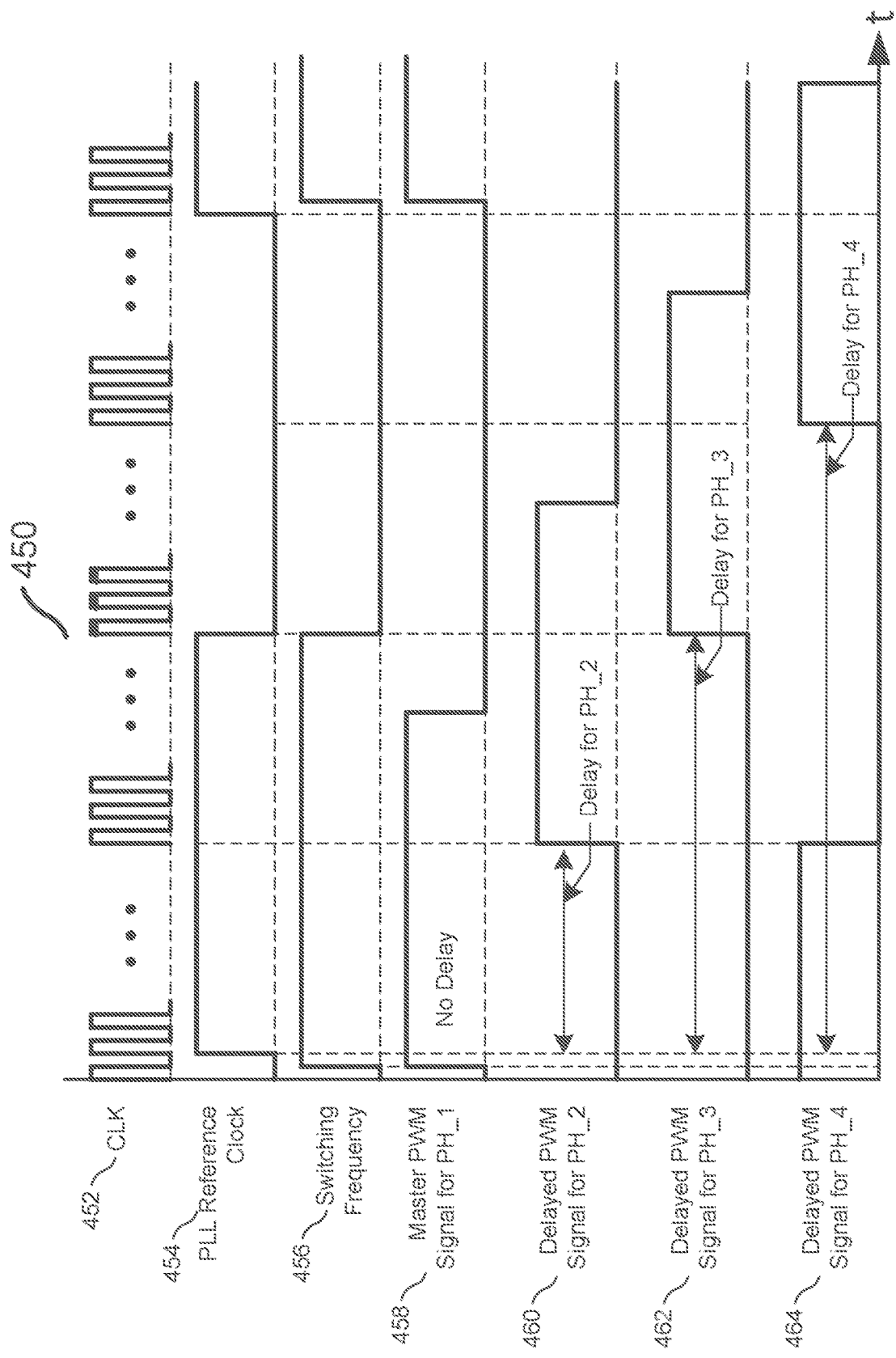
FIG. 6 is a diagram of example waveforms of signals generated during operation of the embodiment delayed PWM signal generator in FIG. 5.

FIG. 6 is a diagram 450 of example waveforms of signals generated during operation of the embodiment delayed PWM signal generator 400 in FIG. 5, using a 4-phase power conversion system as an example. Waveform 452 is the clock signal generated by the master clock circuit 401 with a master clock frequency. Waveform 454 is the PLL reference clock signal generated by the clock divider circuit 402. The frequency of the PLL reference clock signal is the master clock frequency divided by M*N, as described above. Waveform 456 is a switching frequency signal, which is synchronized with the PLL reference clock signal. Note that the synchronized switching frequency may not always be exactly equal to the PLL clock frequency, but within a specified range. Waveform 458 is the master PWM signal, which may be used as the first PWM signal (without any delay) for the first power converter PH_1 of the 4-phase power conversion system. Any delay in this example is with respect to the rising edge of the PLL reference clock signal. Waveform 460 is the second PWM signal that may be used for the second power converter PH_2 of the 4-phase power conversion system, with a delay about one quarter of the period of the PLL reference clock signal. The duty cycle of the second PWM signal is the same as that of the master PWM signal. Waveform 462 is the third PWM signal that may be used for the third power converter PH_3 of the 4-phase power conversion system, with a delay about a half of the period of the PLL reference clock signal. The duty cycle of the third PWM signal is the same as the that of the master PWM signal. Waveform 464 is the fourth PWM signal that may be used for the fourth power converter PH_4 of the 4-phase power conversion system, with a delay about three quarters of the period of the PLL reference clock signal.

Figure 7A:
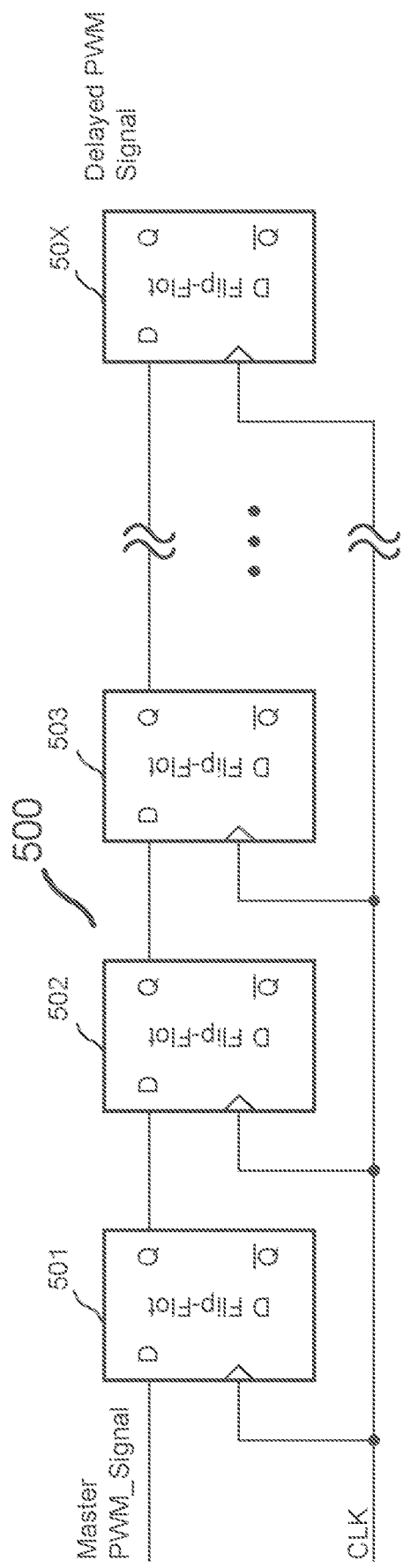
FIG. 7A is a diagram of an embodiment circuit that may be used to delay a signal.

FIG. 7A is a diagram of an embodiment circuit 500 that may be used to delay a signal. The circuit 500 may be used to implement the PWM delay circuit 303 in FIG. 3 and the PWM delay circuit 403 in FIG. 5. The circuit 500 includes a plurality of D flip-flop devices (also referred to as D flip-flops) connected in series, including a first D flip-flop device 501, a second D flip-flop device 502, a third D flip-flop device 503, ... and a $X^{th}$ D flip-flop device 50X. X is a positive integer great than 1. Each D flip-flop device is configured to delay an input signal with a fixed delay time that is controlled by the master clock CLK to generate an output signal. The generated output signal is fed to the next D flip-flop device. As an example, the first D flip-flop device 501 receives a master PWM signal as an input and generates a first output, i.e., a first delayed signal; the first output is then fed to the second D flip-flop device 502, which generates a second delayed signal; and so on. The master PWM signal is thus delayed sequentially by the D flip-flop devices 501-50X, and the output of the $X^{th}$ D flip-flop device 50X is a delayed PWM signal with a desired delay time.

The D flip-flop devices are synchronized with a master clock CLK having a frequency equal to M*N*fs, where fs is a desired switching frequency. The numbers N and M have been defined previously in the present disclosure. M and N are positive integers. N represents the total number of power converters of a multi-phase power conversion system. N is great than 1. M is equal to 2 W, where "W" is an integer greater than or equal to zero (0). The delay time provided by one D flip-flop is represented as Δt, which is also referred as the delay resolution. The delay time Δt may be determined based on the desired switching frequency. For example, for 1 MHz desired switching frequency and 1% delay resolution of the 1 MHz switching frequency, Δt=10 ns. Thus, in this example, the minimum master clock frequency is 100 MHz, and M≥(100 MHz/(fs*N)). In general, the number of M used for a N-phase power conversion system may be determined based on the following:

$$M \geq 1/(N*fs*\Delta t). \quad (1)$$

After M is determined, the number X may be determined based on the following:

$$X \geq M \quad (2)$$

In one example, X may be the next integer number that is greater than M. The circuit 500 may be referred to as a delay cell (or circuit), and is configured for delaying an input signal with a pre-configured delay time, e.g., Δt*X. Multiple such delay cells may be used to provide different delay times.

Figure 7B:
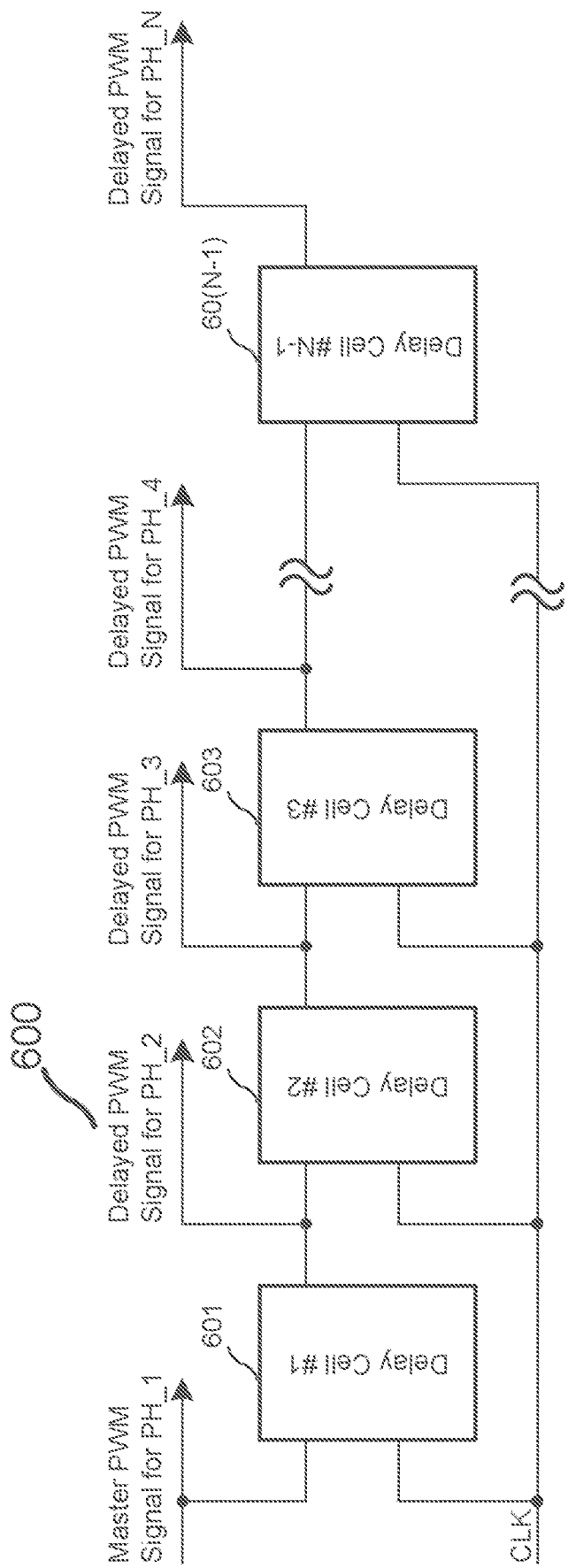
FIG. 7B is diagram of an embodiment PWM delay circuit for generating delayed PWM signals based on the circuit of FIG. 7A.

In some embodiments, the PWM delay circuit 303 or 403 may be implemented based on the delay cells. FIG. 7B is a diagram of an embodiment PWM delay circuit 600 that may be used to implement a delayed PWM signal generator for a N-phase power conversion system. The PWM delay circuit 600 may generate N−1 delayed PWM signals for N−1 power converters of the N-phase power conversion system. As shown, the PWM delay circuit 600 includes N−1 delay cells, i.e., a first delay cell 601, a second delay cell 602, a third delay cell 603, ..., and the $(N-1)^{th}$ delay cell 60(N−1). Each of the N−1 delay cells may be implemented using the circuit 500 in FIG. 7A. The delay cells 601-60(N−1) are connected in series. The first delay cell 601 is configured to take the master PWM signal as input and generate a delayed PWM signal as output. Each subsequent delay cell takes, as input, a delayed PWM signal that is output by the preceding delay cell, and generate a delayed PWM signal as its output. The master PWM signal is thus delayed sequentially by the N−1 delay cells, resulting in N−1 delayed PWM signals.

The master PWM signal may be used as the first delayed PWM signal (with zero delay) for the first power converter PH_1 of the N-phase power conversion system. The delayed PWM signal output by the first delay cell 601 may be used as the second PWM signal for the second power converter PH_2 of the N-phase power conversion system, the delayed PWM signal output by the second delay cell 602 may be used as the third PWM signal for the third power converter PH_3 of the N-phase power conversion system, and similarly, the delayed PWM signal output by the $(N-1)^{th}$ delay cell 60(N−1) may be used as the $N^{th}$ PWM signal for the $N^{th}$ power converter PH_N of the N-phase power conversion system.

In one example, each of the delay cells 601-60(N−1) may provide the same delay time Dt. For example, each of the delay cells is implemented using X D flip-flop devices as shown in FIG. 7A, and Dt=Δt*X, where Δt is the delay time provided by one D flip-flop. Δt is referred to as a delay resolution. A $k^{th}$ PWM signal (for the $k^{th}$ power converter) of the N PWM signals is result of delaying the master PWM signal with a delay time of (k−1) Dt, where k is an integer, and 1≤k≤N.

Note that the delay time used for delaying an input signal by a delay cell may not be exactly equal to 1/(fs*N) for a N-phase power conversion system. Reducing or generally minimizing the input and output ripple voltages of the N-phase power conversion system can still be achieved provided the delay resolution Δt is sufficient small, for example, less than 2% of the desired switching period.

In some embodiments, balance of the output inductor current among the power converters of the multi-phase power conversion system may be achieved by adjusting the delayed PWM signal for each power converter with respect to the current reference signal IREF. The current balance controller in each power converter, e.g., the respective current balance controllers 238 and 268 in the power converters 230 and 260 of FIG. 2, may be configured to adjust a corresponding delayed PWM signal. For example, referring back to FIG. 2, the current balance controller 238 may be configured to adjust the PWM signal PWM_1 232 to generate a control signal to regulate the output inductor current of the power converter 230, and the current balance controller 268 may be configured to adjust the PWM signal PWM_N 262 to generate a control signal to regulate the output inductor current of the power converter 260. The regulation based on the control signals balances the output inductor currents of the power converters and avoids over heating of one or more power converters due to unbalanced output inductor currents.

Figure 8:
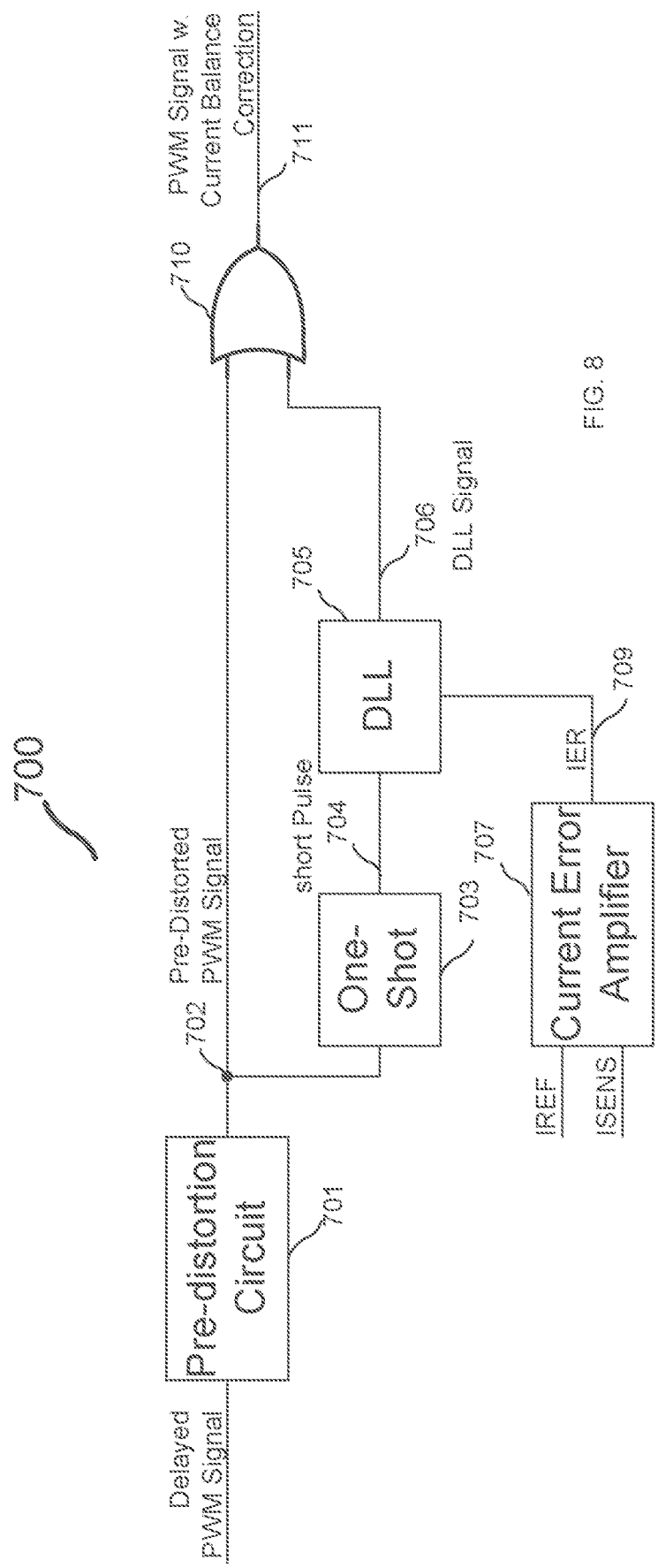
FIG. 8 is a diagram of an embodiment current balance controller that may be used in a power converter.

FIG. 8 is a diagram of embodiment current balance controller 700. The current balance controller 700 will be described in the following with reference to FIG. 2 for illustration convenience. The current balance controller 700 may be used to implement the current balance controllers (e.g., 238 and 268) in the multi-phase power conversion system 200. The current balance controller 700 includes a pre-distortion circuit 701, a one-shot (or one shot) circuit 703, a current error amplifier 707, a DLL (Delay Lock Loop) circuit 705, and an OR gate 710. The pre-distortion circuit 701 is coupled to the OR gate 710 and the one-shot circuit 703. The one-shot circuit 703 and the current error amplifier 707 are coupled to the DLL circuit 705. The input of the current balance controller 700 includes a delayed PWM signal (e.g., PWM_1 232) that is fed by a multi-phase controller (e.g., 210 in FIG. 2) to a power converter (e.g., 230 in FIG. 2) of a multi-phase power conversion system (e.g., 200 in FIG. 2) including multiple power converters. The input of the current balance controller 700 may further include a current reference signal IREF (e.g., IREF 233 in FIG. 2) and a sensed output current of a power converter (e.g., ISENS_1 234 in FIG. 2). The current balance controller 700 outputs a PWM signal 711 with an adjusted pulse width compared with the input delayed PWM signal. The adjusted pulse width reflects the correction of current for a corresponding power converter for current balancing.

The pre-distortion circuit 701 is configured to pre-distort an input signal to reduce the pulse width of the input signal by a preset width to generate a pre-distorted output signal. As an example, the pre-distortion circuit 701 may pre-distort the delayed PWM signal by chopping a pre-determined pulse width of "Y" ns from the pulse width of the delayed PWM signal to generate a pre-distorted PWM signal 702. Y is a real number and may be pre-determined based on one or more circuit parameters, such as an inductor direct current resistance (DCR) variation, trace resistance differences between power converters, on-resistance variations of power switches, and so on. Y may also be referred to as a pre-distortion pulse width. The pre-distorted PWM signal 702 output by the pre-distortion circuit 701 is similar to the input delayed PWM signal except that (1) the pulse width is shortened by Yns, and (2) the delay time increases by Yns. The pre-distorted PWM signal 702 is then fed to the OR gate 710 and the one-shot circuit 703.

The one-shot circuit 703 is configured to generate a pulse signal to trigger the DLL circuit 705 to generate a DLL output signal. The output of the one-shot circuit is a short pulse signal 704. In this example, the short pulse signal 704 has a pulse width that is twice of the pre-distortion pulse width Yns. The short pulse signal 704 triggers operation of the DLL circuit 705.

The DLL circuit 705 is configured to delay an input signal, i.e., the short pulse signal 704, with a delay time to generate a DLL output signal 706, which is fed to the OR gate 710. The DLL output signal 706 may also be referred to as a current sharing pulse signal, which is used to adjust the pulse width of the pre-distorted PWM signal 702 for current balancing of the power converter with other converters of the multi-phase power conversion system. In some embodiments, the delay time of the DLL circuit 705 may be determined based on an error signal IER 709 generated by the current error amplifier 707. The current error amplifier 707 is configured to compare the current reference signal IREF and the sensed output current ISENS, and generate the current error signal IER, which is used to adjust the delay time of the DLL circuit 705 until the output current ISENS matches the IREF signal. The output of the DLL circuit 705 is then Ored with the pre-distorted PWM signal 702 at the OR gate 710. The output of the OR gate 710 is the PWM signal 711 with current balance correction. The PWM signal 711 is used to drive the high side power switch of the power converter, e.g., the power switch 243 of the power converter 230 in FIG. 2. The drive signal for the low side power switch 242 of the power converter is generated by inverting the PWM signal 711.

The PWM signal 711 is generally the input delayed PWM signal with its pulse width pre-distorted and then adjusted (e.g., increased or decreased) based on the DLL output signal 706. The DLL signal is based on the current reference signal IREF and the sensed output current ISENS of the power converter. The current reference signal IREF may be provided by a controller of the multi-phase power conversion system, e.g., the IREF 222 generated by the multi-phase controller 210. That is, in this example, the pulse width of the delayed PWM signal is adjusted based on the output current of the power converter and the current reference. The pulse width of the delayed PWM signal may also be adjusted based on other parameters of the multi-phase power conversion system depending on different applications and uses.

Figure 9:
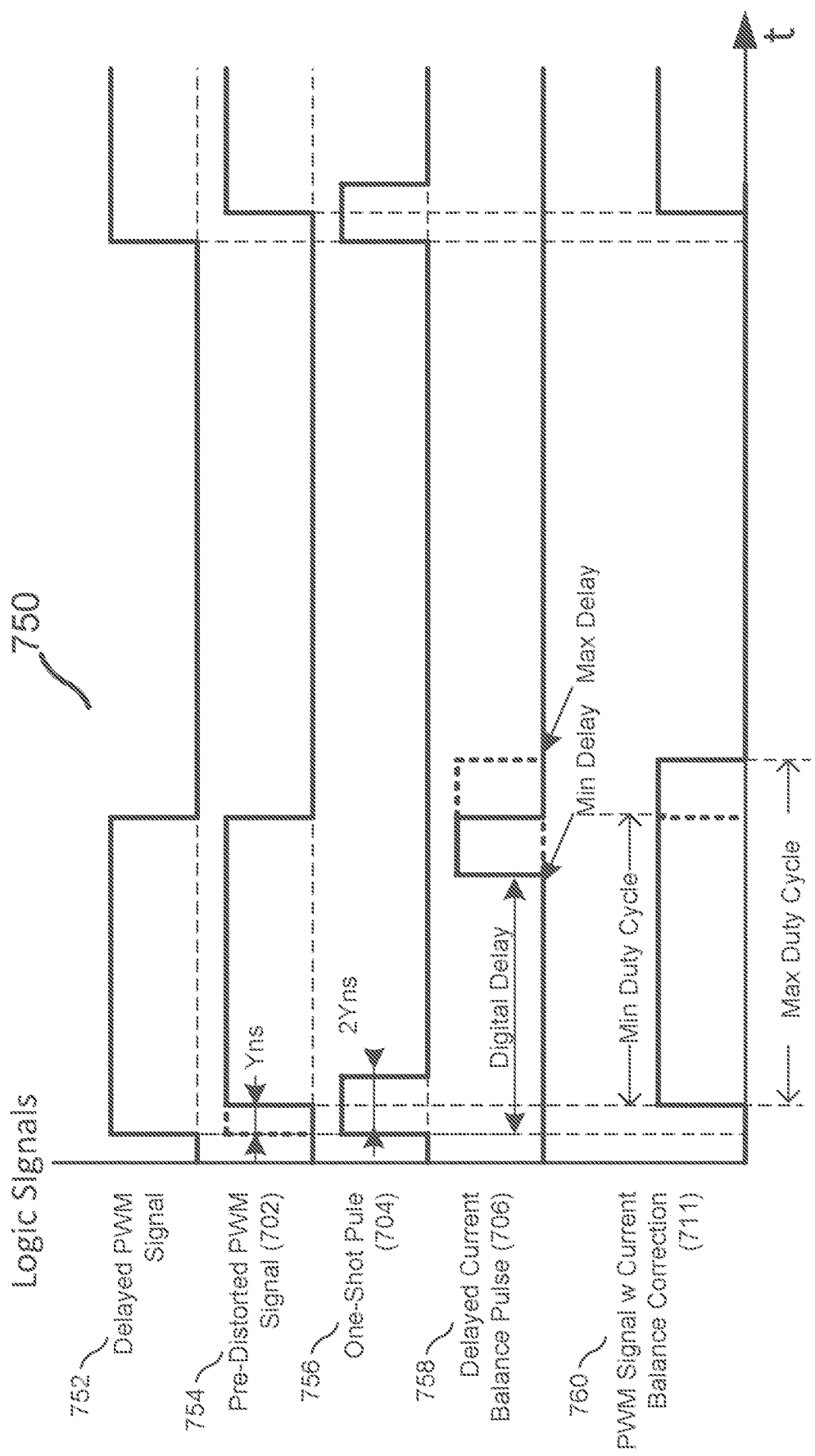
FIG. 9 is a diagram of example waveforms of signals generated during operation of the current balance controller in FIG. 8.

FIG. 9 is a diagram 750 of example waveforms of signals generated during operation of the current balance controller 700 in FIG. 8. Waveform 752 is the delayed PWM signal which is the input signal of the current balance controller 700. Waveform 754 is the pre-distorted PWM signal 702. Waveform 756 is the short pulse signal 704 output from the one-shot circuit 703. Waveform 758 shows the output (i.e., the DLL output signal 706) of the DLL circuit 705. Waveform 760 shows the PWM signal 711 with current balance correction. Please note the pre-distortion of the delayed PWM signal does not need to be happen at the leading edge of the delayed PWM signal. It can also be done at the falling edge of the delayed PWM signal.

In the example of FIG. 9, the PWM signal 711 may have the same pulse width of the pre-distorted PWM signal 702 if the delay time of the DLL circuit 705 is the minimum (the Min Delay as shown in FIG. 9). The pulse width of the PWM signal 711 may be 2*Yns longer than that of the pre-distorted PWM signal 702 if the delay time of the DLL circuit 705 is the maximum (the Max Delay as shown in FIG. 9). The pulse width of the PWM signal 711 may be the same as that of the delayed PWM signal if the delay time of the DLL circuit 705 is in the middle point between the Min Delay and Max Delay.

In some embodiments, when the pulse width of the PWM signal 711 is less than that of the delayed PWM signal, it is likely that the corresponding power converter produces higher output current. When the pulse width of the PWM signal 711 is greater than that of the delayed PWM signal, it is likely that the corresponding power converter produces less output current. Thus, by adjusting the delay time of the DLL circuit 705, the output inductor current of each power converter of the multi-phase power conversion system may be adjusted, and output current balance is thus achieved. The embodiment current balance method may also compensate any errors in the duty cycle of the delayed PWM signals that are caused by errors from the PWM delay circuits and/or trace impedance mis-matches between the multi-phase controller (e.g., 210 in FIG. 2) and power converter (e.g., 230, 260 in FIG. 2) of the multi-phase power conversion system.

The current balance controller 700 may be implemented digitally except the current error amplifier 707. The pre-distortion pulse width "Y"ns may be adjusted digitally to change the range of the current balance correction made to the PWM signal, in order to avoid large oscillations between the output inductor currents. The pre-distortion pulse width "Y"ns may also be dynamically adjusted based on the input and output voltages of the multi-phase power conversion system to maintain the satisfactory current balance performance.

In some embodiments, a method for controlling a multi-phase power conversion system including multiple power converters is provided. The method may include: generating a voltage error signal based on a voltage signal and a voltage reference signal, where the voltage signal is a feedback voltage from the multi-phase power conversion system; generating a first PWM signal based on a ramp signal and the voltage error signal; generating, based on the first PWM signal, PWM signals by delaying the first PWM signal with different delay times; and regulating an output voltage of the multi-phase power conversion system based on the PWM signals. The embodiment method may be applied to the multi-phase power conversion system 200 of FIG. 2, e.g., implemented by the multi-phase controller 210.

As an example, in a N-phase power conversion system including N power converters, N PWM signals may be generated. N is an integer greater than 1. A $k^{th}$ PWM signal of the N PWM signals is generated by delaying the first PWM signal with a delay time $(k-1)\Delta t$, where $\Delta t$ is a preset delay time, k is an integer, and $1 \leq k \leq N$.

In some embodiments, a method for regulating output currents of a multi-phase power conversion system including multiple power converters is provided. The method may include: for each of the multiple power converters, receiving a PWM signal from a controller of the multi-phase power conversion system, with the PWM signal being based on an output voltage of the multi-phase power conversion system; adjusting a pulse width of the PWM signal based on a DLL signal to generate an adjusted PWM signal, where the DLL signal is based on a reference current and an output current of a corresponding power converter of the multiple power converters; and regulating an output voltage of the corresponding power converter based on the adjusted PWM signal. The embodiment method may be implemented by each of the power converters (e.g., 230, 260) the multi-phase power conversion system 200 of FIG. 2.

Although the present disclosure describes systems and circuits with certain components, one or more components may be omitted, combined, or altered as appropriate without departing from the principle and spirit of the present disclosure. Those of ordinary skills in the art would also recognize that many variations, alternatives and modifications may be applicable for various components of the embodiments without departing from the principle and spirit of the present disclosure.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A control system for controlling a multi-phase power conversion system, comprising:
   a pulse width modulation (PWM) comparator, configured to generate a first PWM signal based on a ramp signal, a voltage reference signal and a first voltage signal, the first voltage signal being a feedback voltage from the multi-phase power conversion system, the multi-phase power conversion system comprising N switching power converters, and N being an integer greater than 1; and
   a first circuit, coupled with the PWM comparator and configured to:
      receive the first PWM signal from the PWM comparator;
      generate, based on the first PWM signal, N PWM signals by delaying the first PWM signal with different delay times, a $k^{th}$ PWM signal of the N PWM signals being the first PWM signal delayed with a delay time of $(k-1)\Delta t$, wherein $\Delta t$ is a first delay time, k is an integer, and $1 \leq k \leq N$; and
      feed the N PWM signals to the N switching power converters, respectively, to regulate an output voltage of the multi-phase power conversion system.

2. The control system of claim 1, further comprising:
   a voltage error amplifier, coupled with the PWM comparator and configured to:
      receive the first voltage signal from the multi-phase power conversion system;
      generate a voltage error signal based on the first voltage signal and the voltage reference signal; and
      feed the voltage error signal to the PWM comparator; and
   wherein the PWM comparator is configured to generate the first PWM signal based on the ramp signal and the voltage error signal.

3. The control system of claim 1, wherein the first circuit further comprises:
   a master clock circuit configured to generate a clock signal used for generating the N PWM signals.

4. The control system of claim 1, wherein the first circuit further comprises:
   a signal delay circuit comprising N−1 signal delay sub-circuits coupled in series, each of the N−1 signal delay sub-circuits being configured to delay an input signal with the first delay time Δt, and the signal delay circuit being configured to receive the first PWM signal as an input and output the N PWM signals.

5. The control system of claim 4, wherein each of the N−1 signal delay sub-circuits comprises a plurality of D flip-flop devices connected in series and synchronized with a clock signal.

6. The control system of claim 1, wherein the ramp signal is a fixed voltage ramp signal, an output inductor current signal of a switching power converter of the N switching power converters, or an artificial ripple voltage.

7. The control system of claim 1, further comprising:
a current reference generator circuit, configured to:
receive a sensed output inductor current from each of the N switching power converters;
generate, based on sensed output inductor currents of the N switching power converters, a current reference signal to regulate an output inductor current of each of the N switching power converters; and
feed the current reference signal to each of the N switching power converters.

8. A multi-phase power conversion system comprising:
N switching power converters, each of the N switching power converters comprising a control circuit that is configured to:
receive a first pulse width modulation (PWM) signal from a controller of the multi-phase power conversion system, the PWM signal being based on an output voltage of the multi-phase power conversion system;
adjust a pulse width of the first PWM signal based on a delay lock loop (DLL) signal to generate an adjusted PWM signal, the DLL signal being based on a reference current and an output current of a corresponding switching power converter of the N switching power converters; and
regulate an output current of the corresponding switching power converter of the N switching power converters based on the adjusted PWM signal.

9. The multi-phase power conversion system of claim 8, wherein for a $k^{th}$ switching power converter of the N switching power converters, the first PWM signal is a PWM signal delayed with a delay time of (k−1)Δt, wherein Δt is a first delay time, k is an integer, and 1≤k≤N.

10. The multi-phase power conversion system of claim 8, wherein the control circuit further comprises:
a delay lock loop (DLL) circuit configured to generate the DLL signal.

11. The multi-phase power conversion system of claim 10, wherein the control circuit further comprises:
a one-shot circuit connected to the DLL circuit, the one-shot circuit being configured to generate a pulse signal to trigger generation of the DLL signal by the DLL circuit.

12. The multi-phase power conversion system of claim 11, wherein the DLL circuit is configured to delay the pulse signal with a second delay time to generate the DLL signal.

13. The multi-phase power conversion system of claim 12, wherein the second delay time is determined based on the reference current received from the controller of the multi-phase power conversion system and the output current of the corresponding switching power converter of the N switching power converters.

14. The multi-phase power conversion system of claim 13, wherein the control circuit further comprises:
a current error amplifier connected to the DLL circuit, and configured to generate a current error signal based on the reference current and the output current, the second delay time being based on the current error signal.

15. The multi-phase power conversion system of claim 11, wherein the control circuit further comprises:
a pre-distortion circuit connected to the one-shot circuit, and configured to reduce the pulse width of the first PWM signal by a preset width to generate a second PWM signal, wherein a width of the pulse signal generated by the one-shot circuit is based on the preset width.

16. The multi-phase power conversion system of claim 15, wherein the adjusted PWM signal is generated based on the second PWM signal and the DLL signal.

17. The multi-phase power conversion system of claim 16, wherein the control circuit further comprises an OR gate configured to:
generate the adjusted PWM signal based on the second PWM signal and the DLL signal.

* * * * *